United States Patent
Shiodera et al.

(10) Patent No.: US 10,204,412 B2
(45) Date of Patent: Feb. 12, 2019

(54) MAGNETIC RESONANCE IMAGING APPARATUS, MEDICAL IMAGE PROCESSING DEVICE, AND IMAGE PROCESSING METHOD

(71) Applicant: Toshiba Medical Systems Corporation, Otawara-shi (JP)

(72) Inventors: Taichiro Shiodera, Shinagawa (JP); Takamasa Sugiura, Kawasaki (JP); Tomoyuki Takeguchi, Kawasaki (JP); Masao Yui, Otawara (JP); Naotaka Sakashita, Utsunomiya (JP)

(73) Assignee: Toshiba Medical Systems Corporation, Otawara-shi (JP)

( * ) Notice: Subject to any disclaimer, the term of this patent is extended or adjusted under 35 U.S.C. 154(b) by 98 days.

(21) Appl. No.: 15/337,340

(22) Filed: Oct. 28, 2016

(65) Prior Publication Data

US 2017/0124706 A1    May 4, 2017

(30) Foreign Application Priority Data

Oct. 30, 2015    (JP) ................................ 2015-215262

(51) Int. Cl.
   G06K 9/00        (2006.01)
   G06T 7/00        (2017.01)
   G06T 5/00        (2006.01)
(52) U.S. Cl.
   CPC ............ *G06T 7/0012* (2013.01); *G06T 5/005* (2013.01); *G06T 2207/10088* (2013.01)
(58) Field of Classification Search
   None
   See application file for complete search history.

(56) References Cited

U.S. PATENT DOCUMENTS

2003/0212322 A1*  11/2003  Haacke .............. A61B 5/02007
                                                         600/410
2011/0262017 A1*  10/2011  Haacke ................ G01R 33/443
                                                         382/131

(Continued)

FOREIGN PATENT DOCUMENTS

JP        2012-045121      3/2012
WO     WO 2014/076808 A1   5/2014

OTHER PUBLICATIONS

Yi Wang et al. "Quantitative Susceptibility Mapping (QSM):Decoding MRI Data for a Tissue Magnetic Biomarker", Magnetic Resonance in Medicine, 2015, 20 pages.

*Primary Examiner* — Sean M Conner
(74) *Attorney, Agent, or Firm* — Oblon, McClelland, Maier & Neustadt, L.L.P.

(57) ABSTRACT

A magnetic resonance imaging apparatus according to an embodiment includes processing circuitry. The processing circuitry generates an image based on a magnetic resonance signal from a subject. The processing circuitry generates a susceptibility image representing magnetic susceptibility of the subject from a phase component contained in a plurality of pixels in the image. The processing circuitry generates an artifact component of the susceptibility image based on a frequency signal obtained by frequency transform of the susceptibility image. The processing circuitry generates an artifact component-removed susceptibility image by removing the artifact component from a susceptibility image generated based on the magnetic resonance signal.

11 Claims, 13 Drawing Sheets

(56) References Cited

U.S. PATENT DOCUMENTS

2014/0077808 A1* 3/2014 Jo .................... G01R 33/56545
                                                              324/309
2015/0338492 A1* 11/2015 Sato ................... G01R 33/5608
                                                              600/410

* cited by examiner

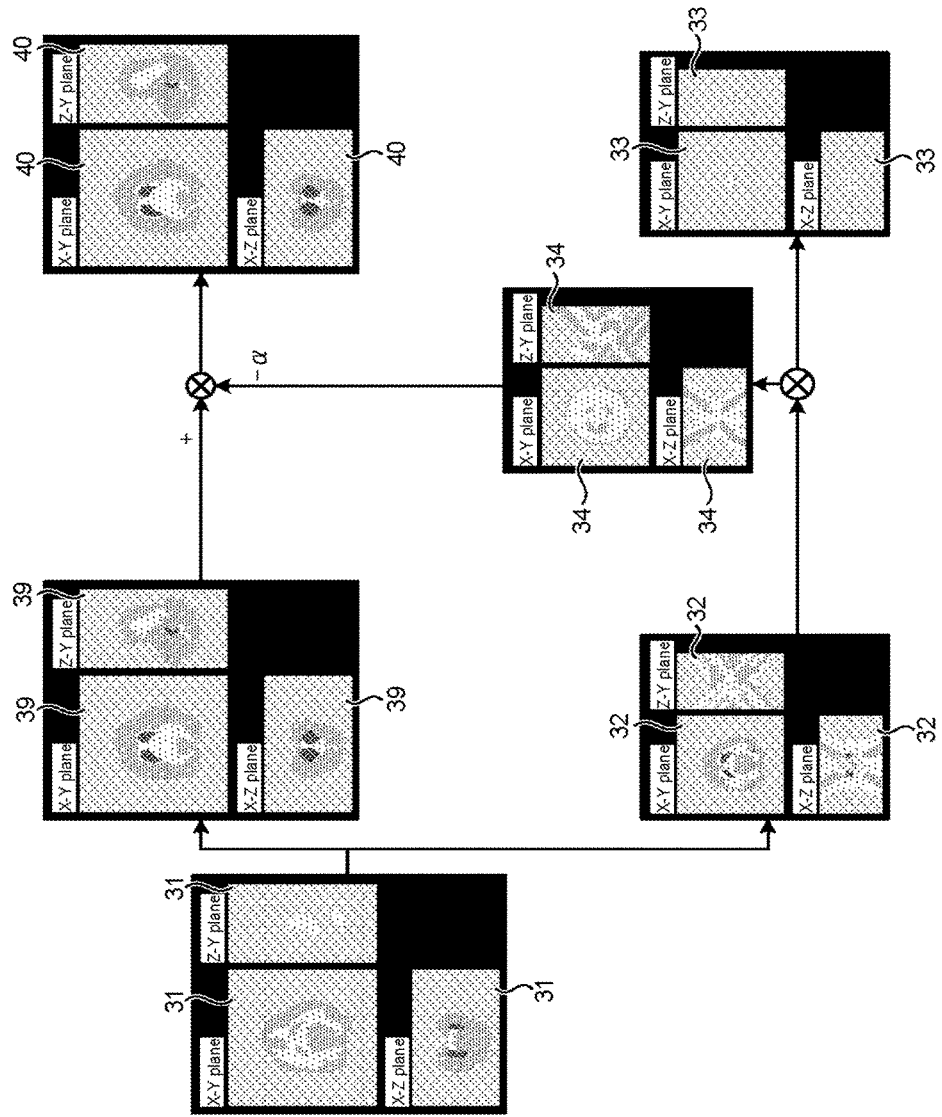

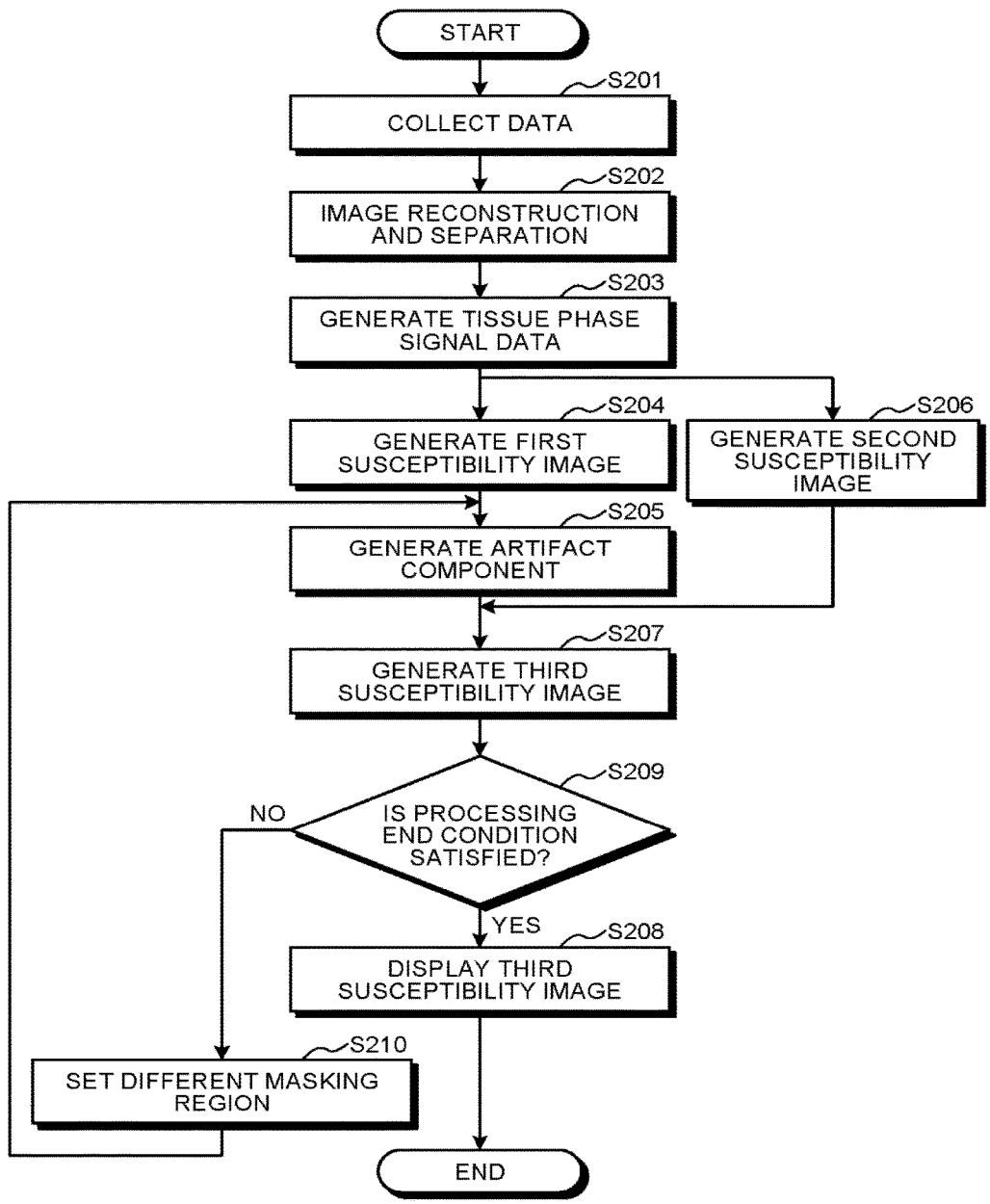

MAGNETIC RESONANCE IMAGING APPARATUS, MEDICAL IMAGE PROCESSING DEVICE, AND IMAGE PROCESSING METHOD

CROSS-REFERENCE TO RELATED APPLICATIONS

This application is based upon and claims the benefit of priority from Japanese Patent Application No. 2015-215262, filed on Oct. 30, 2015; the entire contents of which are incorporated herein by reference.

FIELD

Embodiments described herein relate generally to a magnetic resonance imaging apparatus and a medical image processing device.

BACKGROUND

In magnetic resonance imaging (MRI), quantitative susceptibility mapping (QSM) is known in which tissue susceptibility is generated from phase signals.

As a method for generating susceptibility from a phase image that represents a distribution of phase signal data, inverse transform of an equation representing the relation between susceptibility and phase signal data is known. However, this method is an inverse problem with no unique solution, thereby failing to uniquely generate a correct susceptibility value.

To generate such a susceptibility value, estimating a susceptibility image representing a distribution of approximate susceptibility by using, for example, regularization is widely implemented. However, generating the susceptibility value using regularization is also an inverse problem with no unique solution at or near the magic angle in the frequency space of the susceptibility image. The magic angle is an angle of 55 or 135 degrees relative to the static magnetic field direction from the center (DC position) of the frequency space. This results in streak artifacts (or radial artifacts) having different widths on the susceptibility image mainly in accordance with the size of the noise region on the phase image.

BRIEF DESCRIPTION OF THE DRAWINGS

FIG. 12 is a diagram illustrating an example of processing performed by the MRI apparatus according to the second embodiment; and FIG. 13 is a flowchart illustrating the process of image processing for iteratively generating artifact components by using a plurality of masking regions and repeatedly generating the third susceptibility image in the second embodiment.

DETAILED DESCRIPTION

A magnetic resonance imaging apparatus according to an embodiment includes processing circuitry. The processing circuitry generates an image based on a magnetic resonance signal from a subject. The processing circuitry generates a susceptibility image representing susceptibility of the subject from a phase component contained in a plurality of pixels in the image. The processing circuitry generates an artifact component of the susceptibility image based on a frequency signal obtained by frequency transform of the susceptibility image. The processing circuitry generates an artifact component-removed susceptibility image by removing the artifact component from a susceptibility image generated based on the magnetic resonance signal.

The following describes in detail a magnetic resonance imaging apparatus and a medical image processing device according to embodiments.

First Embodiment

Figure 1:
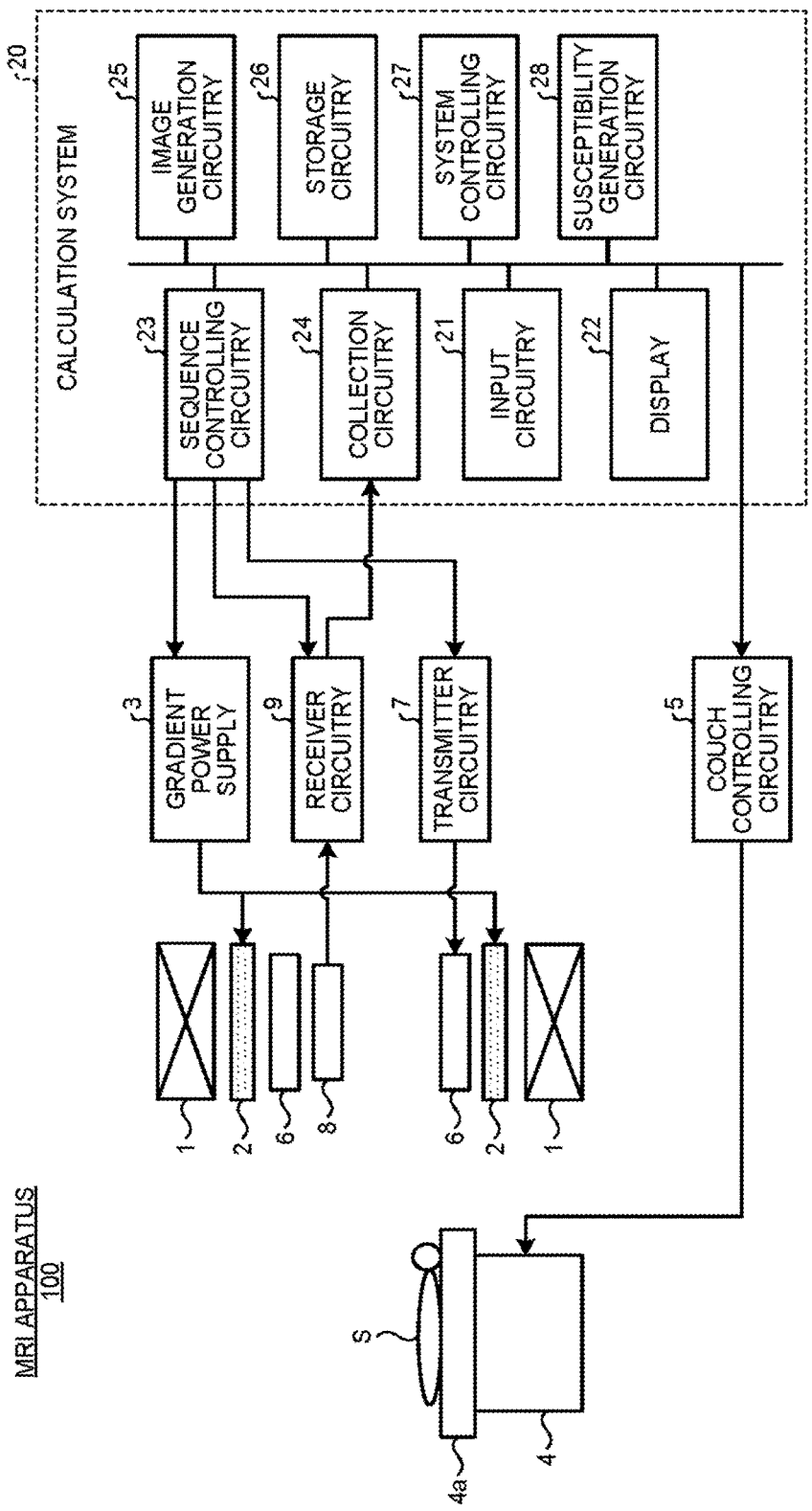
FIG. 1 is a diagram illustrating an example of a configuration of an MRI apparatus according to a first embodiment.

FIG. 1 is a diagram illustrating an example of a configuration of an MRI apparatus according to a first embodiment. As illustrated in FIG. 1, for example, this MRI apparatus 100 includes a static field magnet 1, a gradient coil 2, a gradient power supply 3, a couch 4, couch controlling circuitry 5, a transmitter coil 6, transmitter circuitry 7, a receiver coil 8, receiver circuitry 9, and a calculation system 20.

The static field magnet 1 has a hollow, substantially cylindrical shape, which includes a shape having an oval cross section cut along a plane perpendicular to the center axis of the cylindrical shape. The static field magnet 1 generates a uniform static field in the imaging space inside. The static field magnet 1 is, for example, a permanent magnet or a superconducting magnet.

The gradient coil 2 has a hollow, substantially cylindrical shape, which includes a shape having an oval cross section cut along a plane perpendicular to the center axis of the cylindrical shape. The gradient coil 2 is disposed inside the static field magnet 1. Specifically, the gradient coil 2 is composed of three types of coils corresponding to the x, y, and z axes that are perpendicular to each other. The three coils generate, in the imaging space, gradient fields the intensity of which varies along the x, y, and z axes that are perpendicular to each other by the current separately supplied from the gradient power supply 3. The z-axis is set in the same direction as that of the magnetic flux of the static field.

The gradient power supply 3 supplies power to the gradient coil 2 to cause the gradient coil 2 to generate gradient fields. Specifically, the gradient power supply 3 separately supplies current to the three coils of the gradient coil 2 to cause the three coils to generate gradient fields along the x, y, and z axes as appropriate. Thus, the coils generate gradient fields along the readout direction, the phase encoding direction, and the slice direction, which are perpendicular to each other, in the imaging space. In the following description, the gradient field along the readout direction is referred to as a readout gradient field, the gradient field along the phase encoding direction is referred to as a phase encoding gradient field, and the gradient field along the slice direction is referred to as a slice gradient field.

These three directions are used to add spatial position information to the magnetic resonance (MR) signal. Specifically, the readout gradient field adds position information in the readout direction to the MR signal by causing the frequency of the MR signal to vary in accordance with the positions in the readout direction. The phase encoding gradient field adds position information in the phase encoding direction to the MR signal by causing the phase of the MR signal to vary along the phase encoding direction. The slice gradient field is used, when the imaging region is a slice region, to determine the direction, thickness, and the number of slices of the slice region, and when the imaging region is a volume region, it adds position information in the slice direction to the MR signal by causing the phase of the MR signal to vary in accordance with the positions in the slice direction.

The couch 4 includes a couch top 4a on which a subject S is placed, and sends the couch top 4a into the imaging space formed inside the static field magnet 1 and the gradient coil 2. For example, the couch 4 is set such that the longitudinal direction thereof is parallel to the center axis of the static field magnet 1.

The couch controlling circuitry 5 controls the operations of the couch 4. For example, the couch controlling circuitry 5 controls a drive mechanism included in the couch 4 to cause the couch top 4a to move in the longitudinal direction, upwards or downwards, or to the left or right.

The transmitter coil 6 has a hollow, substantially cylindrical shape, which includes a shape having an oval cross section cut along a plane perpendicular to the center axis of the cylindrical shape. The transmitter coil 6 is disposed inside the gradient coil 2. The transmitter coil 6 applies a radio frequency (RF) field to the imaging space by RF pulsed current supplied from the transmitter circuitry 7.

The transmitter circuitry 7 supplies RF pulsed current corresponding to the Larmor frequency to the transmitter coil 6.

The receiver coil 8 is attached to the subject S placed in the imaging space and receives the MR signal from the subject S. The MR signal is emitted from the subject by the influence of the RF field applied by the transmitter coil 6. The receiver coil 8 outputs the received MR signal to the receiver circuitry 9. As the receiver coil 8, for example, a different type of coil is used depending on a part to be imaged. Examples of such a coil include a receiver coil for abdomen, a receiver coil for head, and a receiver coil for spine.

The receiver circuitry 9 generates MR signal data based on the MR signal received by the receiver coil 8. Specifically, the receiver circuitry 9 converts the MR signal to digital MR signal data, and transmits the generated MR signal data to collection circuitry 24.

In this context, the transmitter coil 6 applies the RF field and the receiver coil 8 receives the MR signal, but embodiments are not limited to this. For example, the transmitter coil 6 may include a receiver function that receives the MR signal, or the receiver coil 8 may include a transmitter function that applies the RF field. If the transmitter coil 6 includes the receiver function, the receiver circuitry 9 generates the MR signal data from the MR signal received by the transmitter coil 6. If the receiver coil 8 includes the transmitter function, the transmitter circuitry 7 supplies the RF pulsed current to the receiver coil 8.

The calculation system 20 controls the entire operation of the MRI apparatus 100. For example, the calculation system 20 includes input circuitry 21, a display 22, a sequence controller 23, the collection circuitry 24, image generation circuitry 25, storage circuitry 26, a system controller 27, and susceptibility generation circuitry 28.

The input circuitry 21 receives input of various types of instructions and information from an operator. The input circuitry 21 is implemented by, for example, a keyboard, a mouse, a trackball, a touch panel, buttons, and a switch. The input circuitry 21 is connected to the system controller 27. The input circuitry 21 converts the input from the operator into an electrical signal and outputs it to the system controller 27.

The display 22 displays various types of information and images. The display 22 displays, for example, graphical user interfaces (GUIs) for receiving instructions and information from the operator. The display 22 displays, for example, images generated by the image generation circuitry 25. The display 22 is implemented by, for example, a liquid crystal monitor, a cathode-ray tube (CRT) monitor, or a touch panel.

The sequence controller 23 executes various types of scan operations. Specifically, the sequence controller 23 causes the gradient power supply 3, the transmitter circuitry 7, and the receiver circuitry 9 to operate in accordance with sequence execution data transmitted from the system controller 27 to execute the scan operations. The sequence execution data defines a pulse sequence indicating the process of collecting the MR signal data. Specifically, the sequence execution data defines, for example, supply timing of current supplied by the gradient power supply 3 to the gradient coil 2 and the intensity of the supplied current, RF transmission timing of the transmitter circuitry 7 to the transmitter coil 6 and the intensity of the transmitted RF pulsed current, and detection timing of the MR signal by the receiver circuitry 9. The sequence controller 23 is implemented by, for example, a processor.

The collection circuitry 24 collects the MR signal data generated by the receiver circuitry 9 as a result of a scan operation. Specifically, when the collection circuitry 24 receives the MR signal data from the receiver circuitry 9, the collection circuitry 24 performs correction processing such as averaging and phase correction on the received MR signal data, and transmits the corrected MR signal data to the image generation circuitry 25. A set of MR signal data collected by the collection circuitry 24 is stored in the storage circuitry 26 as data constituting the k-space after each MR signal data in the set is two-dimensionally or three-dimensionally arranged in accordance with the position information added by the readout gradient magnetic field, the phase encoding gradient magnetic field, and the slice gradient magnetic field.

The image generation circuitry 25 generates an image based on the MR signal data collected by the collection circuitry 24. When the image generation circuitry 25 receives MR signal data from the collection circuitry 24, the image generation circuitry 25 performs, for example, post-processing on the received MR signal data, that is, reconstruction processing such as Fourier transform to generate an image of the subject S. In other words, the image generation circuitry 25 generates an image based on the MR signal from the subject S.

The image generation circuitry 25 transmits data of the generated image to the storage circuitry 26. Data of each pixel constituting the image is complex data. The complex data contains an absolute value component and a phase component, and the absolute value component and the phase component can be separated from each other as a magnitude signal and a phase signal, respectively. Thus, the image generation circuitry 25 may transmit the data of an image to the storage circuitry 26 as complex data, or may separate the complex data into magnitude signal data and phase signal data and transmit them to the storage circuitry 26. The image generation circuitry 25 is implemented by, for example, a processor. The image generation circuitry 25 is an example of an image generation unit.

The storage circuitry 26 stores therein various types of data. For example, the storage circuitry 26 stores therein MR signal data collected by the sequence controller 23 and data of images generated by the image generation circuitry 25 for each subject S. The storage circuitry 26 also stores therein computer programs and data used by the sequence controller 23, the collection circuitry 24, the image generation circuitry 25, and the system controller 27 in performing processing of their own. The storage circuitry 26 is implemented by, for example, a random access memory (RAM), a semiconductor memory device such as a flash memory, a hard disk, or an optical disc.

The system controller 27 controls the components included in the MRI apparatus 100, thereby controlling the entire operation of the MRI apparatus 100. For example, the system controller 27 receives input of various imaging parameters from the operator via the input circuitry 21. The system controller 27 generates sequence execution data based on the received imaging parameters and transmits the generated data to the sequence controller 23 to execute various types of scan operations.

After executing a scan operation, the system controller 27 stores MR signal data transmitted from the collection circuitry 24 and data of an image transmitted from the image generation circuitry 25 in the storage circuitry 26. The system controller 27 reads an image requested by the operator from the storage circuitry 26 and outputs the read image to the display 22. The system controller 27 controls, for example, the couch controlling circuitry 5 in accordance with an instruction from the operator via the input circuitry 21 to move the couch 4. The system controller 27 is implemented by, for example, a processor.

The susceptibility generation circuitry 28 generates a susceptibility image based on the MR signal data collected by the collection circuitry 24. The susceptibility generation circuitry 28 is implemented by, for example, a processor.

The aforementioned term "processor" refers to, for example, a central processing unit (CPU) or graphics processing unit (GPU), or a circuit such as application specific integrated circuit (ASIC), a simple programmable logic device (SPLD), a complex programmable logic device (CPLD), or a field programmable gate array (FPGA). The computer programs may be installed directly in the circuit of the processor instead of being stored in the storage circuitry 26. In this case, the processor reads the computer programs installed in the circuit and executes them to implement the functions.

An example of the configuration of the MRI apparatus 100 according to the first embodiment has been described.

Yi Wang et al., "Quantitative Susceptibility Mapping (QSM): Decoding MRI Data for a Tissue Magnetic Biomarker", Magnetic Resonance in Medicine 73: 82-101 (2015) describes the morphology enabled dipole inversion (MEDI) method. In this method, tissue susceptibility is highly accurately generated using a regularization approach, and, on the assumption that the magnitude image, which represents distribution of the magnitude signal, is similar to the susceptibility image, an edge image is generated from the magnitude image, and a final susceptibility is calculated such that regions out of the edge region in the susceptibility image have a higher spatial continuity.

International Patent Publication No. WO2014/076808 describes a method of calculating the final susceptibility by generating an edge image from a tentative susceptibility image and smoothing the edge image.

In the MEDI method and the method described in International Patent Publication No. WO2014/076808, an edge image is generated from a magnitude image or a susceptibility image and the final susceptibility is calculated such that regions out of the edge region in the susceptibility image have a higher spatial continuity.

When the noise region on the phase image is small, using these methods reduces streak artifacts having a narrow width on the susceptibility image by smoothing the non-edge regions. However, when the noise region on the phase image is large, streak artifacts having a wide width appear over the susceptibility image and such wide streak artifacts are difficult to reduce by smoothing.

The MRI apparatus 100 according to the first embodiment is configured to generate information used for preventing a certain type of artifact such as a streak artifact having a wide width from occurring. Now, the details will be described below.

Figure 2:
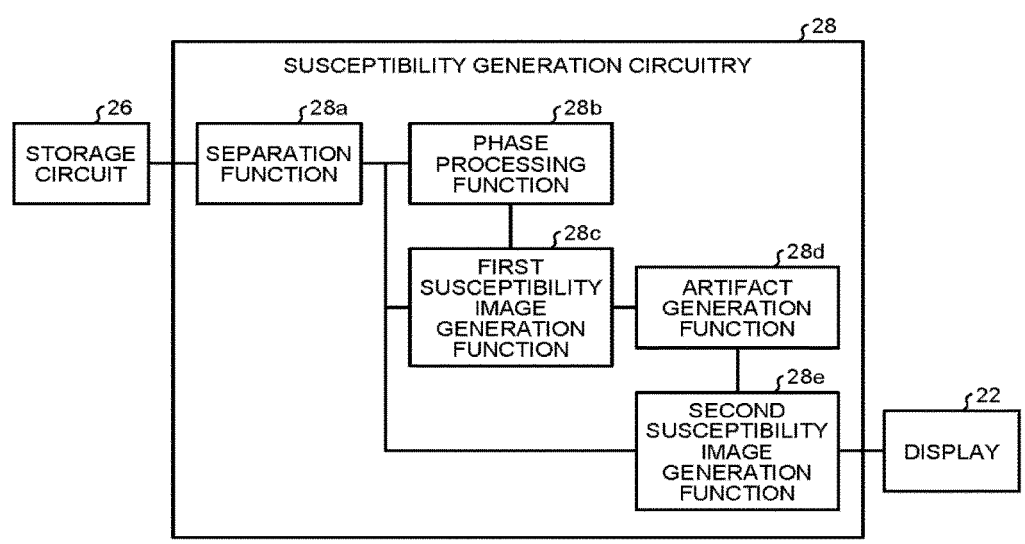
FIG. 2 is a block diagram illustrating an example of a configuration of functions included in the MRI apparatus according to the first embodiment.

FIG. 2 is a block diagram illustrating an example of a configuration of functions included in the MRI apparatus 100 according to the first embodiment. FIG. 2 illustrates the display 22, the storage circuitry 26, and the susceptibility generation circuitry 28 out of the components included in the calculation system 20 illustrated in FIG. 1. As illustrated in FIG. 2, the susceptibility generation circuitry 28 includes a separation function 28a, a phase processing function 28b, a first susceptibility image generation function 28c, an artifact generation function 28d, and a second susceptibility image generation function 28e.

The separation function 28a, the phase processing function 28b, the first susceptibility image generation function 28c, the artifact generation function 28d, and the second susceptibility image generation function 28e in the susceptibility generation circuitry 28 are stored in the storage circuitry 26 as a computer-executable program, for example. The susceptibility generation circuitry 28 reads a computer program from the storage circuitry 26 and executes it to implement the function corresponding to the computer program. In other words, the susceptibility generation circuitry 28 that has read a computer program has the corresponding function illustrated in the susceptibility generation circuitry 28 in FIG. 2. Although FIG. 2 illustrates a single susceptibility generation circuitry 28 that implements the separation function 28a, the phase processing function 28b, the first susceptibility image generation function 28c, the artifact generation function 28d, and the second susceptibility image generation function 28e, the susceptibility generation circuitry 28 may be configured by a plurality of independent processors so that the processors execute the respective computer programs to implement the functions. The functions included in the susceptibility generation circuitry 28 and the functions included in the image generation circuitry 25 may be included in single processing circuitry. Such processing circuitry is implemented by a processor.

When data of an image stored in the storage circuitry 26 is complex data, the separation function 28a separates the complex data into magnitude signal data and phase signal data, and transmits the phase signal data to the phase processing function 28b, the first susceptibility image generation function 28c, and the second susceptibility image generation function 28e. When the data of an image stored in the storage circuitry has already been separated into the magnitude signal data and the phase signal data, the separation function 28a transmits the phase signal data to the phase processing function 28b, the first susceptibility image generation function 28c, and the second susceptibility image generation function 28e without performing the separation processing.

The phase processing function 28b extracts tissue phase signal data based on the data of an image stored in the storage circuitry 26. The tissue phase signal data is phase signal data derived from body tissue susceptibility of the subject S. The phase processing function 28b transmits the extracted tissue phase signal data to the first susceptibility image generation function 28c, and the second susceptibility image generation function 28e.

The first susceptibility image generation function 28c generates susceptibility of a body tissue based on the tissue phase signal data, and generates a first susceptibility image each pixel of which represents susceptibility. The first susceptibility image generation function 28c transmits the generated first susceptibility image to the artifact generation function 28d. The first susceptibility image generation function 28c is an example of a first susceptibility image generation unit.

The artifact generation function 28d generates an artifact component based on the first susceptibility image transmitted from the first susceptibility image generation function 28c, and transmits the generated artifact component to the second susceptibility image generation function 28e. The artifact generation function 28d is an example of an artifact generation unit.

The second susceptibility image generation function 28e generates susceptibility of the body tissue having a smaller artifact based on the tissue phase signal data and the artifact component, and transmits, to the display 22, a second susceptibility image each pixel of which represents susceptibility. The second susceptibility image generation function 28e is an example of a second susceptibility image generation unit.

Flowchart

Figure 3:
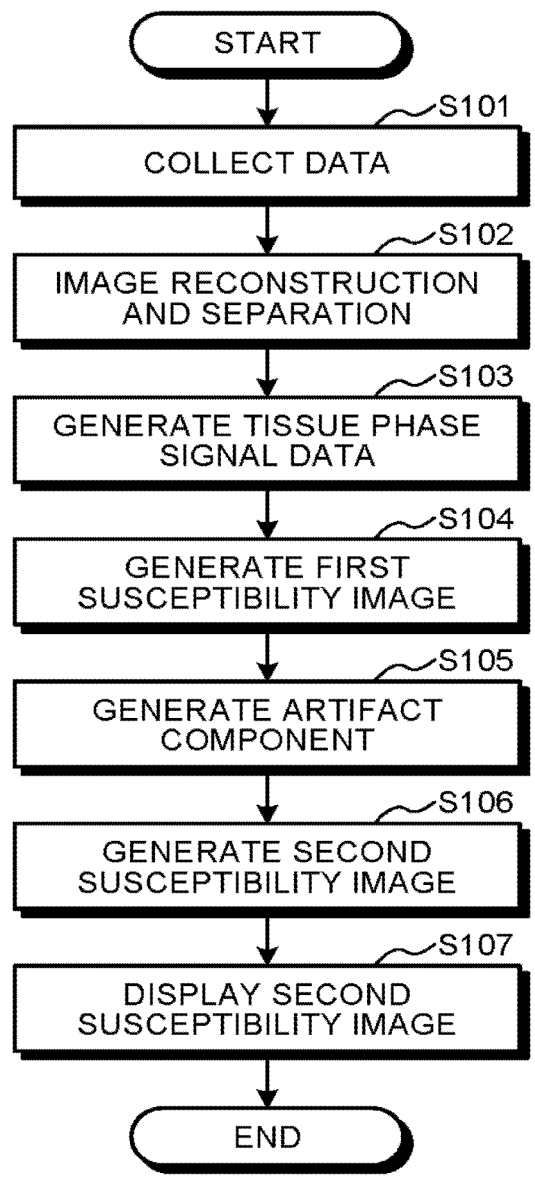
FIG. 3 is a flowchart illustrating the process of image processing performed by the MRI apparatus according to the first embodiment.

FIG. 3 is a flowchart illustrating the process of image processing performed by the MRI apparatus 100 according to the first embodiment.

First, as illustrated in FIG. 3, the sequence controller 23 receives a setting of an imaging plan from the operator and collects data (Step S101). For example, the system controller 27 stores therein in advance information on pulse sequences including initial values of imaging parameters such as repetition time (TR) and echo time (TE). For example, the system controller 27 manages a set of pulse sequences including a pulse sequence for a pre-scan and a pulse sequence for the main scan with respect to each part to be imaged or an imaging purpose. The system controller 27 presents sets of pulse sequences each corresponding to a part to be imaged or an imaging purpose to the operator, and receives operator's selection or alterations on the sets of pulse sequences via GUIs, thereby receiving a set of pulse sequences to be performed on a part to be monitored and receiving the setting of imaging parameters. The system controller 27 generates sequence execution data based on the received set of pulse sequences for the part to be monitored and the received imaging parameters. Upon receiving an instruction to start the pre-scan from the operator via the input circuitry 21, the system controller 27 transmits the sequence execution data for executing the pre-scan to the sequence controller 23. The sequence controller 23 executes a scan operation for collecting a sensitivity map as the pre-scan. The collection circuitry 24 then collects MR signal data obtained in the pre-scan, and the image generation circuitry 25 generates the sensitivity map based on the collected MR signal data. The pre-scan may include, for example, a scan operation for shimming and a scan operation for collecting positioning images for use in determining a position of a diagnostic image. Upon receiving an instruction to start the main scan from the operator via the input circuitry 21, the system controller 27 transmits the sequence execution data for executing the main scan to the sequence controller 23. The sequence controller 23 then executes the main scan. For example, the sequence controller 23 executes a scan operation for collecting a diagnostic image as the main scan. The collection circuitry 24 then collects MR signal data obtained in the main scan, and the image generation circuitry 25 reconstructs the diagnostic image based on the collected MR signal data and the sensitivity map.

The separation function 28a separates the complex data generated as data of the image by the image generation circuitry 25 into magnitude signal data and phase signal data (Step S102). The separation function 28a transmits the phase signal data to the phase processing function 28b, the first susceptibility image generation function 28c, and the second susceptibility image generation function 28e.

Upon receiving the phase signal data transmitted from the separation function 28a, the phase processing function 28b extracts, from the received phase signal data, tissue phase signal data that is phase signal data derived from the susceptibility of a body tissue (Step S103).

For example, the phase processing function 28b applies phase unwrapping to the collected phase signal data being wrapped in a range from $-\pi$ to $+\pi$ to generate unwrapped phase signal data. The phase processing function 28b may employ phase unwrapping for MRI apparatuses such as Laplacian unwrapping or region growing, or may employ phase unwrapping for synthetic aperture radars, for example. The phase processing function 28b then applies the background field removal to the unwrapped phase signal data to remove phase data affected by a non-local field convoluted with the phase signal data, and extracts tissue phase signal data that is phase signal data derived from the susceptibility of a body tissue. The phase processing function 28b may employ, as the background field removal, high-pass filtering, or any one of the background field removal techniques described in Yi Wang et al. such as sophisticated harmonic artifact reduction for phase data (SHARP), regularization enabled SHARP (RESHARP), and projection onto dipole fields (PDF). The phase processing function 28b transmits the extracted tissue phase signal data to the first susceptibility image generation function 28c, and the second susceptibility image generation function 28e.

The first susceptibility image generation function 28c generates a first susceptibility image based on the tissue phase signal data transmitted from the phase processing function 28b (Step S104).

As a method for generating susceptibility from the tissue phase signal data, inverse transform of Equation (1) described in Yi Wang et al. is known.

$$\delta = d*\chi \quad (1)$$

Where $\chi$ represents susceptibility, d represents a coefficient relating to dipole kernel representing the behavior of magnetic dipole, $\delta$ represents a value called local field map, and * represents convolution.

As expressed in Equation (2) below, $\delta$ is obtained by dividing tissue phase signal data $\theta$ by magnetic rotation ratio $\gamma$, field magnitude B0, and echo time TE.

$$\delta = -\frac{\theta}{\gamma \cdot B_0 \cdot TE} \quad (2)$$

Equation (1) can be expressed as simple multiplication as indicated by Equation (3) below by applying Fourier transform.

$$\delta = F^{-1}[DF[\chi]] \quad (3)$$

Where D is Fourier transform of d and is represented by coordinates (kx, ky, kz) of k-space data. In the following description, the kz direction corresponds to the static field direction.

Susceptibility $\chi$ can be generated by inverse transform of Equation (3). However, D−1 that is the reciprocal of D in Equation (4) below is zero when the relation between kx, ky, and kz satisfies the following Equation (5).

$$D = \frac{1}{3} - \frac{k_z^2}{k_x^2 + k_y^2 + k_z^2} \quad (4)$$

$$\frac{1}{3} = \frac{k_z^2}{k_x^2 + k_y^2 + k_z^2} \quad (5)$$

Thus, the inverse transform of Equation (3) is an ill-posed inverse problem. The positional relation in the frequency space between kx, ky, and kz satisfying Equation (5) is called the magic angle. As a solution to this ill-posedness, regularization-based optimization is known to generate susceptibility. In this optimization method, regularization terms such as spatial smoothness of the susceptibility and an edge structure are added. For example, minimizing $f(\chi 1)$ of Equation (6) below is a method for generating the first susceptibility image.

$$f(x_1) = \|W(\delta - F^{-1}[DF[x_1]])\|_2 + \lambda \|Gx_1\|_p \quad (6)$$

The first term on the right side of Equation (6) is a data term representing the degree of match of Equation (3) above, and the second term is a regularization term representing spatial smoothness of the susceptibility. In Equation (6), $\lambda$ represents a parameter relating the regularization term, W represents a weighting coefficient, G represents a gradient operator, and p represents norm. For example, the weighting coefficient W is determined based on magnitude images between a plurality of echoes.

The first susceptibility image generation function 28c according to the first embodiment generates the first susceptibility image $\chi 1$ by applying an optimization method to Equation (6), such as Newton's method, the steepest descent method, the conjugate gradient method, the nonlinear conjugate gradient method, the penalty method, or the alternating direction method of multipliers (ADMM). In other words, the first susceptibility image generation function 28c generates the first susceptibility image $\chi 1$ representing the susceptibility of the subject S from the phase component contained in a plurality of pixels of the image generated by the image generation circuitry 25. In the first susceptibility image $\chi 1$, the streak artifact component having a narrow width is reduced, but the streak artifact component having a wide width remains.

The artifact generation function 28d generates an artifact component from the frequency signal of the first susceptibility image $\chi 1$ (Step S105).

For example, the artifact generation function 28d performs frequency transform on the first susceptibility image $\chi 1$ such as Fourier transform or discrete cosine transform and generates an artifact component $\chi a$ by processing the frequency space of the first susceptibility image $\chi 1$. In other words, the artifact generation function 28d generates the artifact component $\chi a$ of the first susceptibility image $\chi 1$ based on the frequency signal obtained by frequency transform of the first susceptibility image $\chi 1$. That is, the first susceptibility image $\chi 1$ is said to be the source of the artifact component $\chi a$. Examples of the method for generating the artifact component include masking processing on the frequency space of the first susceptibility image $\chi 1$.

Figure 4A:
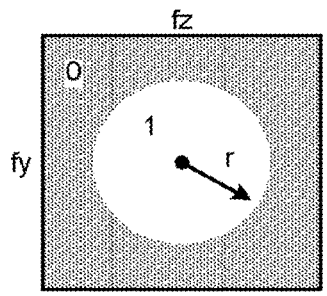
FIG. 4A is a diagram illustrating an example of masking.
Figure 4B:
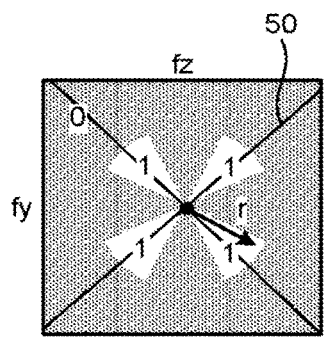
FIG. 4B is a diagram illustrating another example of masking.
Figure 4C:
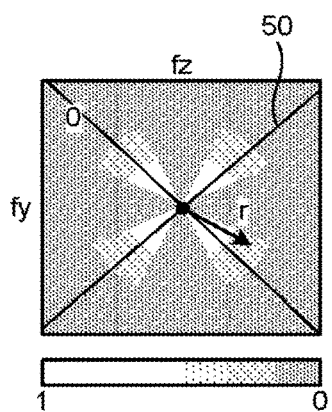
FIG. 4C is a diagram illustrating still another example of masking.

FIGS. 4A to 4D are diagrams illustrating examples of masking. FIGS. 4A to 4C each illustrates a three-dimensional (3D) frequency space of a susceptibility image with respect to the y direction (fy) and the z direction (fz) with the x direction (fx) being the DC component position. The region indicated by "1" is a signal pass-through region, and the region indicated by "0" is a signal non-pass-through region.

Figure 4D:
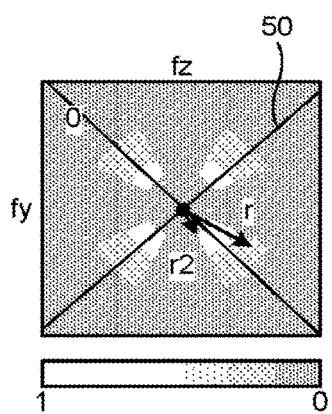
FIG. 4D is a diagram illustrating yet another example of masking.

FIG. 4A illustrates a mask that only allows low-frequency components within a distance r from the DC component position of all the fx, fy, and fz to pass through. FIG. 4B illustrates a mask that covers a wider region than that in FIG. 4A such that only frequency components at and near magic angle 50 pass through. The magic angle 50 is an angle at which the spin-spin interaction is zero. FIG. 4C illustrates a mask that is based on the mask of FIG. 4B and whose mask boundaries are blurred on a scale from 0 to 1 so that the regions on either side of the boundaries are smoothly contiguous. FIG. 4D illustrates a mask that is based on the mask of FIG. 4B and that causes low-frequency components within a distance r2 from the DC component position not to pass through to eliminate the low-frequency components that represent the structure of the susceptibility image and to generate only the artifact component. As described above, the artifact generation function 28d generates the artifact component by applying masking to the frequency space of the first susceptibility image $\chi 1$ such that a frequency component at and near the magic angle 50 passes through. For example, the artifact generation function 28d generates an artifact component having a wide streak width. The masking described above is also referred to as frequency space masking on the first susceptibility image $\chi^1$.

Described now is an example of how the distance r is determined. For example, the width of the artifact is determined by the size of a susceptibility region to be focused in the first susceptibility image χ1. Thus, the artifact generation function 28d determines r in accordance with the size of the region. Because the width of the artifact increases with the size of this region, the artifact generation function 28d sets r such that, for example, r has a smaller value in a gradual direction. When r has a small value, only low-frequency components pass through, thereby obtaining a gradual signal.

Subsequently, the second susceptibility image generation function 28e generates a second susceptibility image by using the artifact component (Step S106). For example, the second susceptibility image generation function 28e uses Equation (7) below as an optimization function including a term for reducing the artifact component generated when the tissue phase signal data is inverse-transformed by using Equation (6) above.

$$f(x_2) = \|W(\delta - f^{-1}[DF[x_2]])\|_2 + \lambda_1 \|Gx_2\|_p + \lambda_2 \|H(x_a, x_2)\|_p \quad (7)$$

In Equation (7), the third term on the right side has a small value when the second susceptibility image χ2 has a small artifact component χa, and H(a,b) is an operator representing the degree of match between a and b. The operator representing the degree of match may perform any operation for calculating the degree of match between two signals, such as calculating an error, correlation coefficient, or inner product. χ1 and χ2 are parameters relating to the second and third terms, respectively.

The second susceptibility image generation function 28e minimizes f(χ2) of Equation (7) to generate a second susceptibility image χ2 from which the artifact component is reduced (or removed). For example, the second susceptibility image generation function 28e generates a second susceptibility image χ2 from which an artifact component having a wide width is reduced (or removed). In Equation (7), W represents a weighting coefficient, and the second susceptibility image generation function 28e performs the weighted difference processing in accordance with the susceptibility value of each pixel in the first susceptibility image χ1. The third term on the right side of Equation (7) has a small value when the second susceptibility image χ2 has a small artifact component χa. Thus, the second susceptibility image generation function 28e generates the second susceptibility image χ2 by using regularization for reducing the artifact component χa.

At Step S106, the second susceptibility image χ2 from which an artifact component having a wide width is reduced or removed is generated based on the artifact component. In other words, at Step S106, the second susceptibility image generation function 28e generates the second susceptibility image χ2 that is an artifact component-reduced or removed susceptibility image (a susceptibility image from which an artifact component is reduced or removed) by reducing or removing the artifact component from the first susceptibility image λ1 generated based on the MR signal. At Step S105 before Step S106, the artifact generation function 28d generates an artifact component from the frequency signal of the first susceptibility image χ1 as information used for preventing a certain type of artifact such as an artifact having a wide width from occurring. Thus, the MRI apparatus 100 according to the first embodiment can generate information used for preventing a certain type of artifact from occurring. Japanese Patent Publication Laid-open No. 2012-045121 discloses a technique of detecting candidates for pixels representing components of streak artifacts in a reconstructed image. However, Japanese Patent Publication Laid-open No. 2012-045121 does not disclose a technique of generating, from the frequency signal of the first susceptibility image, information used for preventing a certain type of artifact from occurring.

Subsequently, the system controller 27 causes the display 22 to display the second susceptibility image χ2 (Step S107), and the image processing ends. The second susceptibility image generation function 28e may store the generated second susceptibility image in the storage circuitry 26.

The display 22 displays at least the second susceptibility image. The display 22 may display the magnitude image and the phase image together with the second susceptibility image under the same display conditions such as the slice position. The display 22 may display a magnitude value, a phase value, and a susceptibility value of a certain coordinates.

Figure 5:
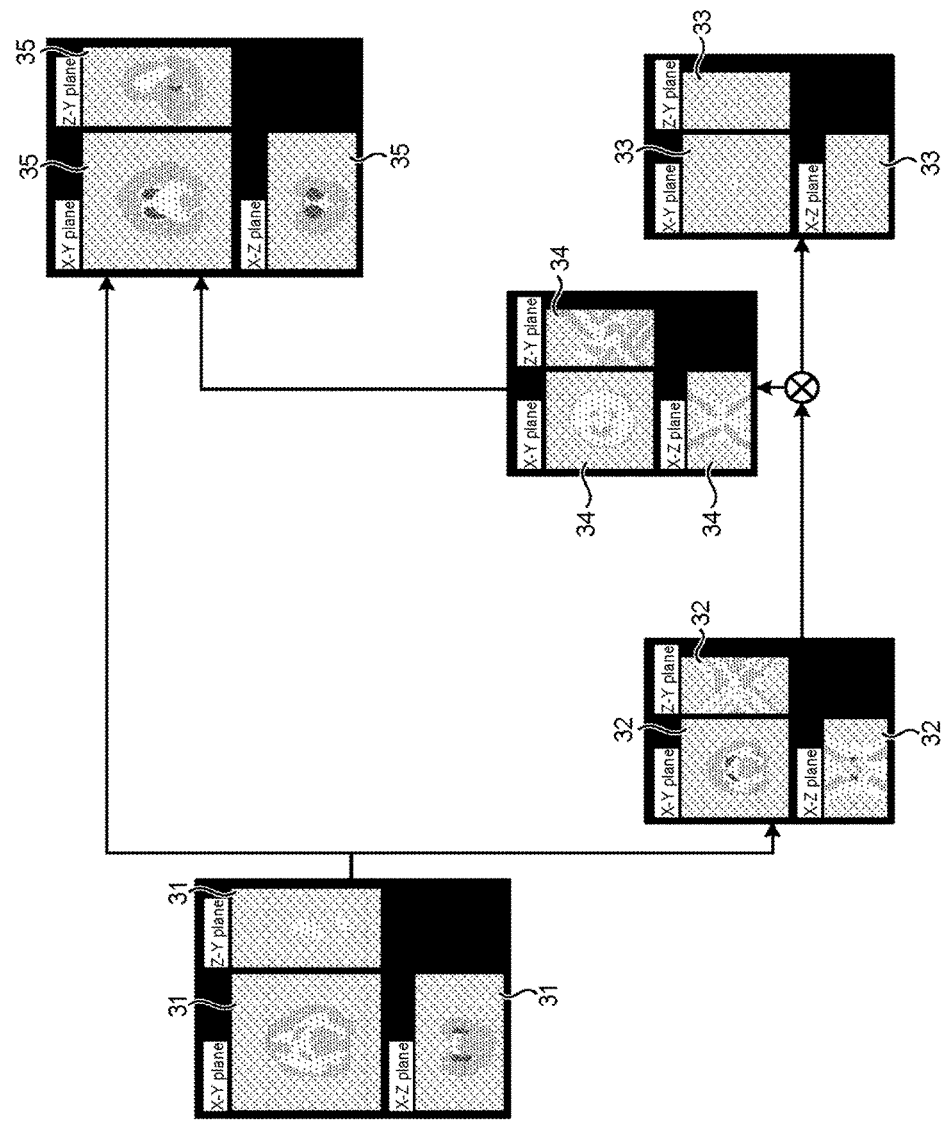
FIG. 5 is a diagram illustrating an example of the image processing according to the first embodiment.

FIG. 5 is a diagram illustrating an example of the image processing according to the first embodiment. At Step S103, the phase processing function 28b extracts three-dimensional tissue phase signal data 31 as illustrated in the example of FIG. 5. FIG. 5 illustrates projections of the tissue phase signal data each projected on the fx-fy plane, the fz-fy plane, and the fx-fz plane.

At Step S104, the first susceptibility image generation function 28c generates a three-dimensional first susceptibility image 32 based on the tissue phase signal data 31 as illustrated in the example of FIG. 5. FIG. 5 illustrates projections of the first susceptibility image 32 each projected on the fx-fy plane, the fz-fy plane, and the fx-fz plane.

At Step S105, the artifact generation function 28d performs masking processing on the frequency space of the first susceptibility image 32 by using a three-dimensional frequency space mask 33 to generate an artifact component 34 as illustrated in the example of FIG. 5. FIG. 5 illustrates projections of the frequency space mask 33 and projections of the artifact component 34 each projected on the fx-fy plane, the fz-fy plane, and the fx-fz plane.

At Step S106, the second susceptibility image generation function 28e generates a three-dimensional second susceptibility image 35 by using the tissue phase signal data 31 and the artifact component 34 as illustrated in the example of FIG. 5. FIG. 5 illustrates projections of the second susceptibility image 35 each projected on the fx-fy plane, the fz-fy plane, and the fx-fz plane.

The first susceptibility image generation function 28c may generate the first susceptibility image χ1 by using a parameter different from the parameter that the second susceptibility image generation function 28e uses to generate the second susceptibility image χ2 so that the artifact generation function 28d can generate the artifact component accurately.

For example, the regularization parameter λ in Equation (6) may have a value different from the value of λ1 in Equation (7). When, for example, λ is set to a value smaller than that of λ1, the artifact component in the first susceptibility image χ1 is enhanced. Accordingly, the artifact generation function 28d generates an enhanced artifact component. When, for example, λ is set to a value larger than that of λ1, the artifact component in the first susceptibility image χ1 is smoothed. Accordingly, the artifact generation function 28d generates a smoothed artifact component.

For another example, the iteration number n of the optimization processing represented by Equation (6) for generating the first susceptibility image $\chi^1$ may differ from the iteration number n1 of the optimization processing represented by Equation (7) for generating the second susceptibility image χ2. When p=1, in general, the image becomes sharper as the iteration number increases, which also enhances noise. The artifact component to be generated varies dependent on the iteration number.

For still another example, the weighting coefficient W or gradient parameter G in Equation (6) may have a value different from a value of the weighting coefficient W or gradient parameter G in Equation (7). The first susceptibility image generation function 28c may generate the first susceptibility image $\chi 1$ without using the weighting coefficient W (assuming that all W are 1). The first susceptibility image generation function 28c may generate the first susceptibility image $\chi 1$ without using the weighting coefficient W or gradient parameter G in Equation (7) (assuming that both W and G are 1).

For yet another example, the norm p in Equation (6) may have a value different from that of norm p in Equation (7). When p=2 (L2 norm), Equation (6) is an L2 norm optimization problem that can be analytically solved. This optimization can generate the susceptibility image at high speed, but generates a blurred image due to relatively high smoothing. When p=1, Equation (6) is an L1 norm optimization problem that is numerically solved. This optimization generates a high-resolution susceptibility image. Considering that the artifact generation function 28d generates the artifact component from the first susceptibility image, the first susceptibility image generation function 28c generates the first susceptibility image using Equation (6) under p=2 at high speed, and the second susceptibility image generation function 28e generates the second susceptibility image using Equation (7) under p=1, for example.

Modification of Artifact Component

The artifact component $\chi a$ may contain a susceptibility component of a brain tissue. Thus, it is preferred to generate the artifact component $\chi a$ after removal of the susceptibility component of the brain tissue. As indicated by Equations (8) and (9) below, the artifact generation function 28d sets an artifact component weighting coefficient Wa in accordance with the susceptibility value of each pixel in the first susceptibility image $\chi 1$. The artifact generation function 28d weights the artifact component $\chi a$ with the artifact component weighting coefficient Wa. The artifact component weighting coefficient Wa may be smoothed within a range from 0 to 1. $\chi a'$ represents an artifact component weighted by the artifact component weighting coefficient.

$$x'_a = w_a x_a \qquad (8)$$

$$w_a = \begin{cases} 0 & \text{if}(|x_1| > Th) \\ 1 & \text{else} \end{cases} \qquad (9)$$

Figure 6:
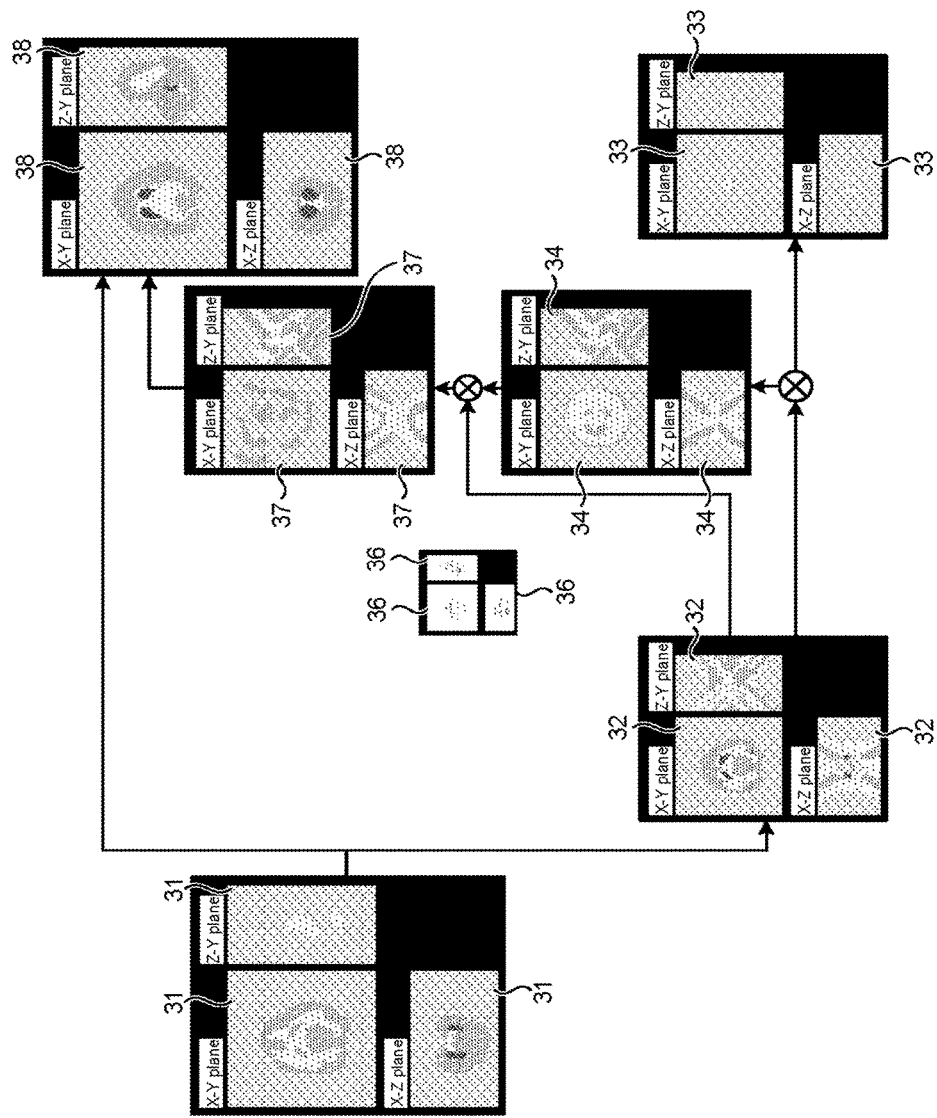
FIG. 6 is a diagram illustrating an example of weighting processing on an artifact component with an artifact component weighting coefficient.

FIG. 6 is a diagram illustrating an example of the weighting processing on an artifact component with an artifact component weighting coefficient. At Step S105, the artifact generation function 28d weights an artifact component 34 with an artifact component weighting coefficient 36 to generate an artifact component 37 as illustrated in the example of FIG. 6. FIG. 6 illustrates projections of the artifact component weighting coefficient 36 and projections of the artifact component 37 each projected on the fx-fy plane, the fz-fy plane, and the fx-fz plane.

At Step S106, the second susceptibility image generation function 28e generates a three-dimensional second susceptibility image 38 by using the tissue phase signal data 31 and the artifact component 37 as illustrated in the example of FIG. 6. FIG. 6 illustrates projections of the second susceptibility image 38 each projected on the fx-fy plane, the fz-fy plane, and the fx-fz plane.

Another Method for Determining Artifact Component Weighting Coefficient

Figure 7A:
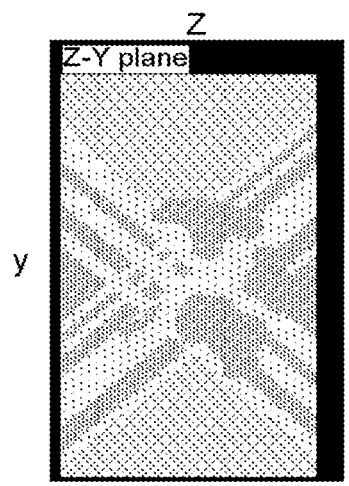
FIG. 7A is a diagram illustrating an example of a first susceptibility image.
Figure 7B:
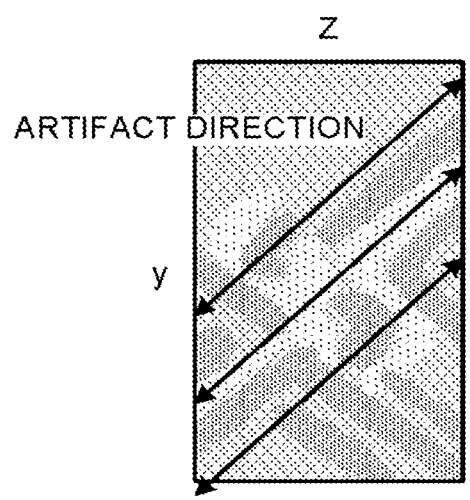
FIG. 7B is a diagram illustrating an example of an artifact component generated from the first susceptibility image illustrated in the example of FIG. 7A.
Figure 8:
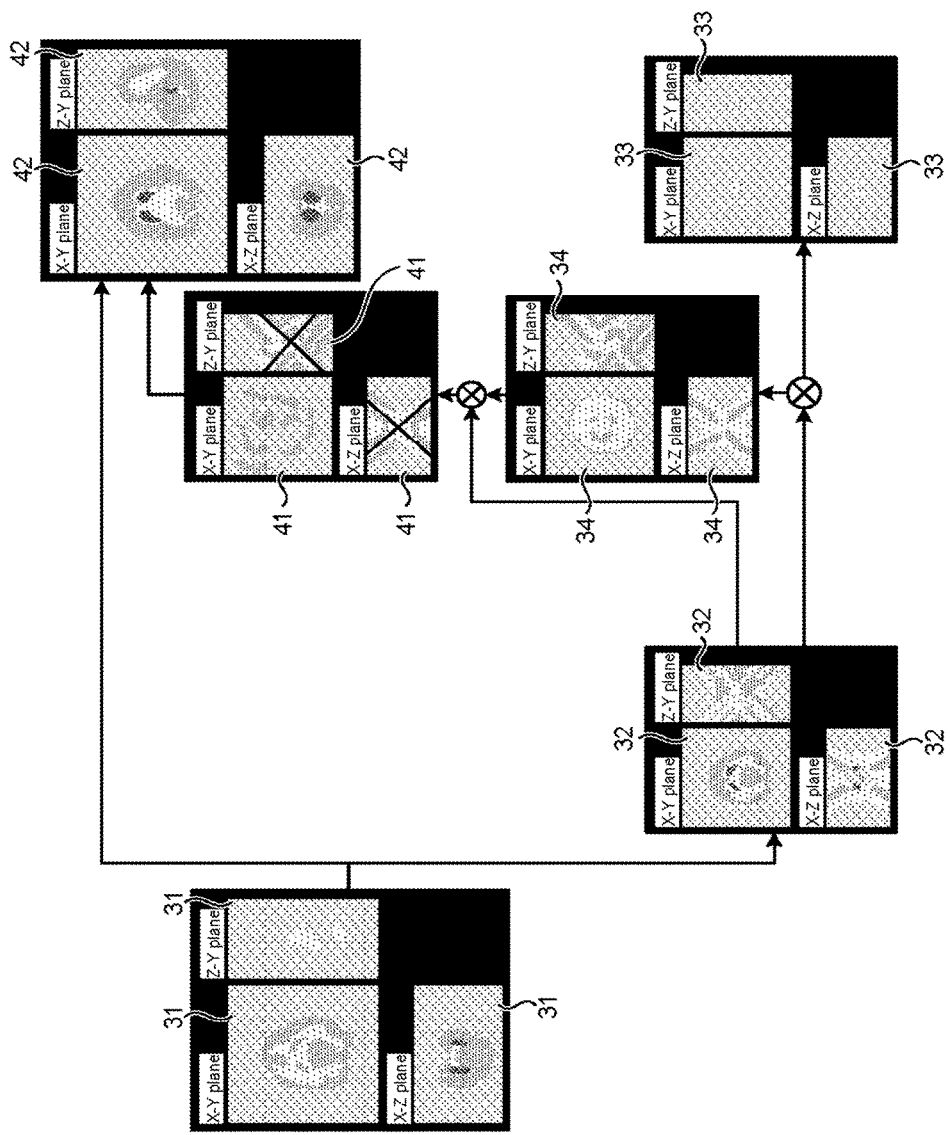
FIG. 8 is a diagram illustrating an example of processing in which an artifact component is smoothed along an artifact direction and is used as a new artifact component.

When noise occurs at the magic angle direction in the frequency space, the noise has a substantially constant direction in the susceptibility image space, which is a typical cause of the artifact component $\chi a$. Thus, the directivity of the artifact component (artifact direction) is known in the susceptibility image space, and an artifact component that has been smoothed along the artifact direction may be used as a new artifact component. FIG. 7A is a diagram illustrating an example of the first susceptibility image. FIG. 7B is a diagram illustrating an example of an artifact component generated from the first susceptibility image illustrated in the example of FIG. 7A. FIG. 8 is a diagram illustrating an example of processing in which an artifact component is smoothed along an artifact direction and is used as a new artifact component. The artifact direction may be uniquely set from the magic angle direction, or may be set by using a direction detection operator such as the Sobel operator on each pixel unit.

At Step S105, the artifact generation function 28d applies smoothing on the artifact component 34 along the artifact direction to generate a new artifact component 41 as illustrated in the example of FIG. 8. In other words, the artifact generation function 28d determines the artifact component weighting coefficient Wa such that an artifact along the artifact direction is weighted by 1 whereas an artifact not along the artifact direction is weighted by 0. FIG. 8 illustrates projections of the artifact component 41 each projected on the fx-fy plane, the fz-fy plane, and the fx-fz plane.

At Step S106, the second susceptibility image generation function 28e generates a three-dimensional second susceptibility image 42 by using the tissue phase signal data 31 and the artifact component 41 as illustrated in the example of FIG. 8. FIG. 8 illustrates projections of the second susceptibility image 42 each projected on the fx-fy plane, the fz-fy plane, and the fx-fz plane.

Iterative Method for Generating Artifact Component

Figure 9:
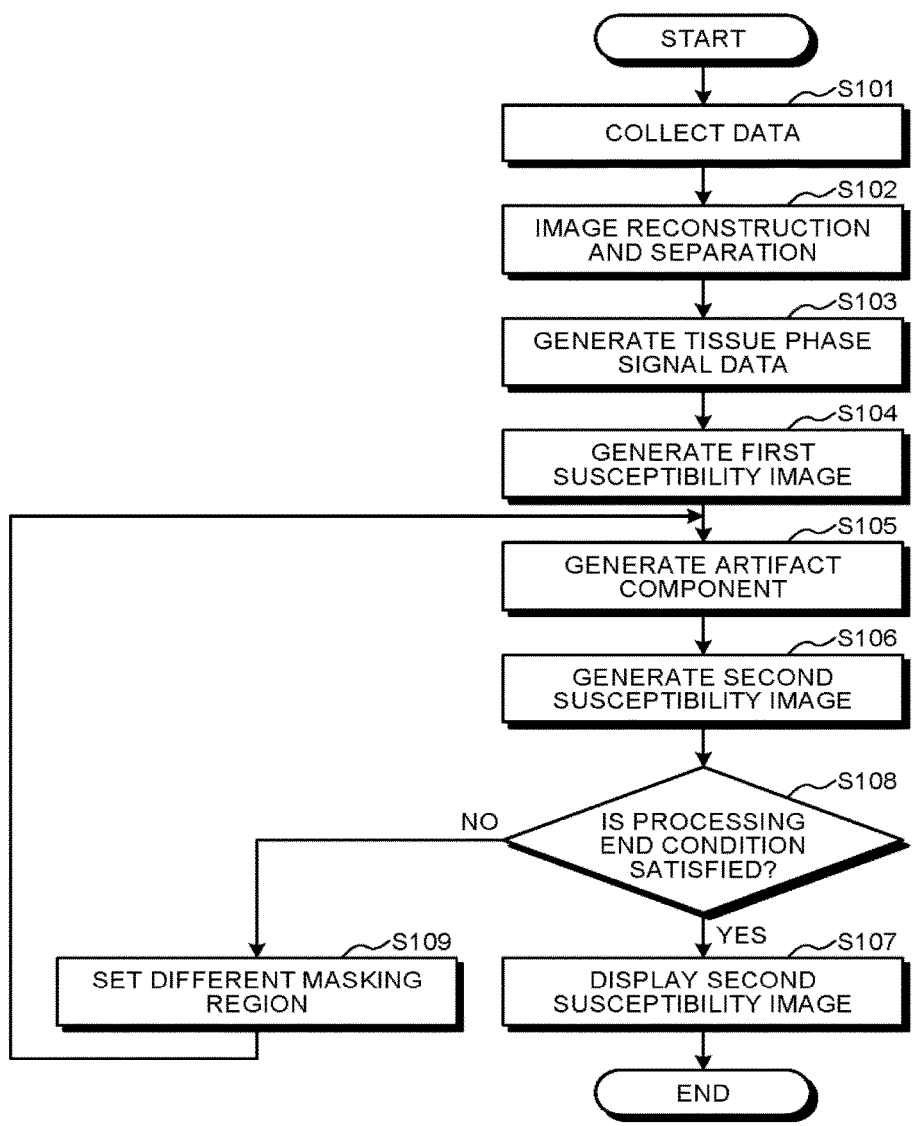
FIG. 9 is a flowchart illustrating the process of image processing for iteratively generating artifact components by using a plurality of masking regions and repeatedly generating the second susceptibility image.

The masking region is not limited to a single type, and a plurality of masking regions may be prepared to iteratively generate artifact components. FIG. 9 is a flowchart illustrating the process of image processing for iteratively generating artifact components by using a plurality of masking regions and repeatedly generating the second susceptibility image. The differences between the image processing illustrated in FIG. 9 and that in FIG. 3 will be described. In the image processing illustrated in FIG. 9, after the second susceptibility image generation function 28e generates the second susceptibility image (Step S106), the artifact generation function 28d determines whether a processing end condition is satisfied (Step S108). If the processing end condition is satisfied (Yes at Step S108), the system controller 27 causes the display 22 to display the second susceptibility image (Step S107) and the image processing ends.

If the processing end condition is not satisfied (No at Step S108), the artifact generation function 28d sets a different masking region (Step S109) and generates another artifact component (Step S105). Setting a different masking region allows a different frequency component to pass through, thereby generating a different artifact component. Thus, the second susceptibility image generated again at Step S106 is a susceptibility image from which an artifact component having a different width is removed. The MRI apparatus 100 according to the first embodiment iteratively repeats generation of artifact components by the artifact generation function 28d and generation of the second susceptibility image by the second susceptibility image generation function 28e by applying different types of frequency space masking to the first susceptibility image.

The processing end condition is satisfied when, for example, artifact components are sufficiently reduced or the negative determination (No at Step S108) is repeated a certain times or more at Step S108.

Other examples as to when the processing end condition is satisfied will be described. Assume that the artifact generation function 28d has a copy of the first susceptibility image as a comparative data to be used in the determination at Step S108, and every time the artifact generation function 28d generates an artifact component, it subtracts the absolute value of the generated artifact component from the copy of the first susceptibility image. Under the assumption described above, the processing end condition is satisfied when the absolute value of the artifact component in the copy of the first susceptibility image is equal to or lower than a threshold. The operator may visually check the second susceptibility image and input an instruction to end or continue the processing to the susceptibility generation circuitry 28 by using the input circuitry 21 such as a mouse.

The MRI apparatus 100 according to the first embodiment has been described. The MRI apparatus 100 according to the first embodiment can generate information used for preventing a certain type of artifact from occurring.

Second Embodiment

Figure 10:
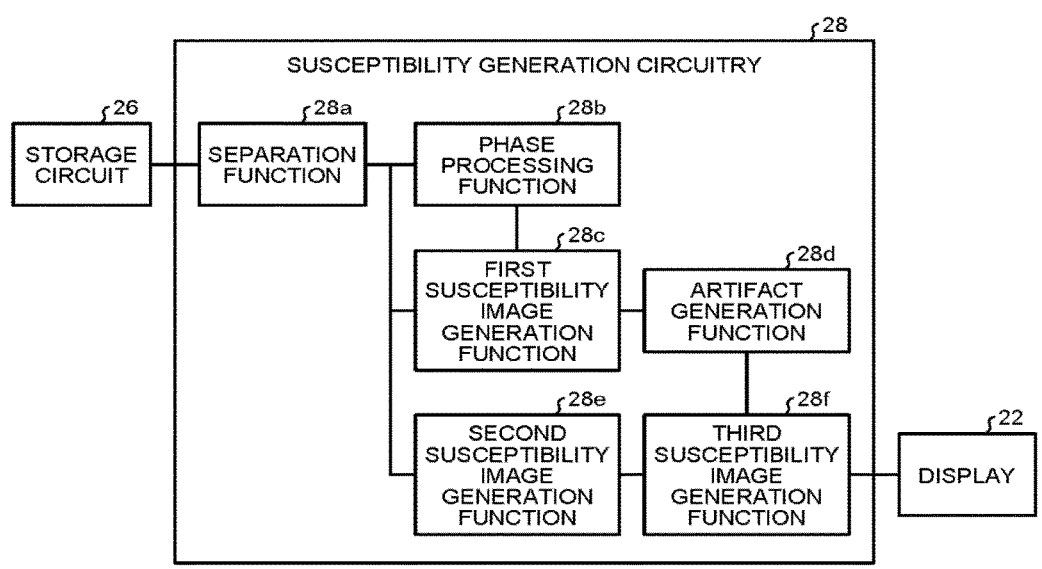
FIG. 10 is a diagram illustrating an example of a configuration of susceptibility generation circuitry included in an MRI apparatus according to a second embodiment.

An MRI apparatus 100 according to a second embodiment will be described. FIG. 10 is a diagram illustrating an example of a configuration of the susceptibility generation circuitry in the MRI apparatus according to the second embodiment. The susceptibility generation circuitry 28 according to the second embodiment differs from that of the first embodiment in that the susceptibility generation circuitry 28 according to the second embodiment includes a third susceptibility image generation function 28f. The third susceptibility image generation function 28f generates a third susceptibility image based on the second susceptibility image transmitted from the second susceptibility image generation function 28e and the artifact component transmitted from the artifact generation function 28d, and causes the display 22 to display the generated third susceptibility image.

Figure 11:
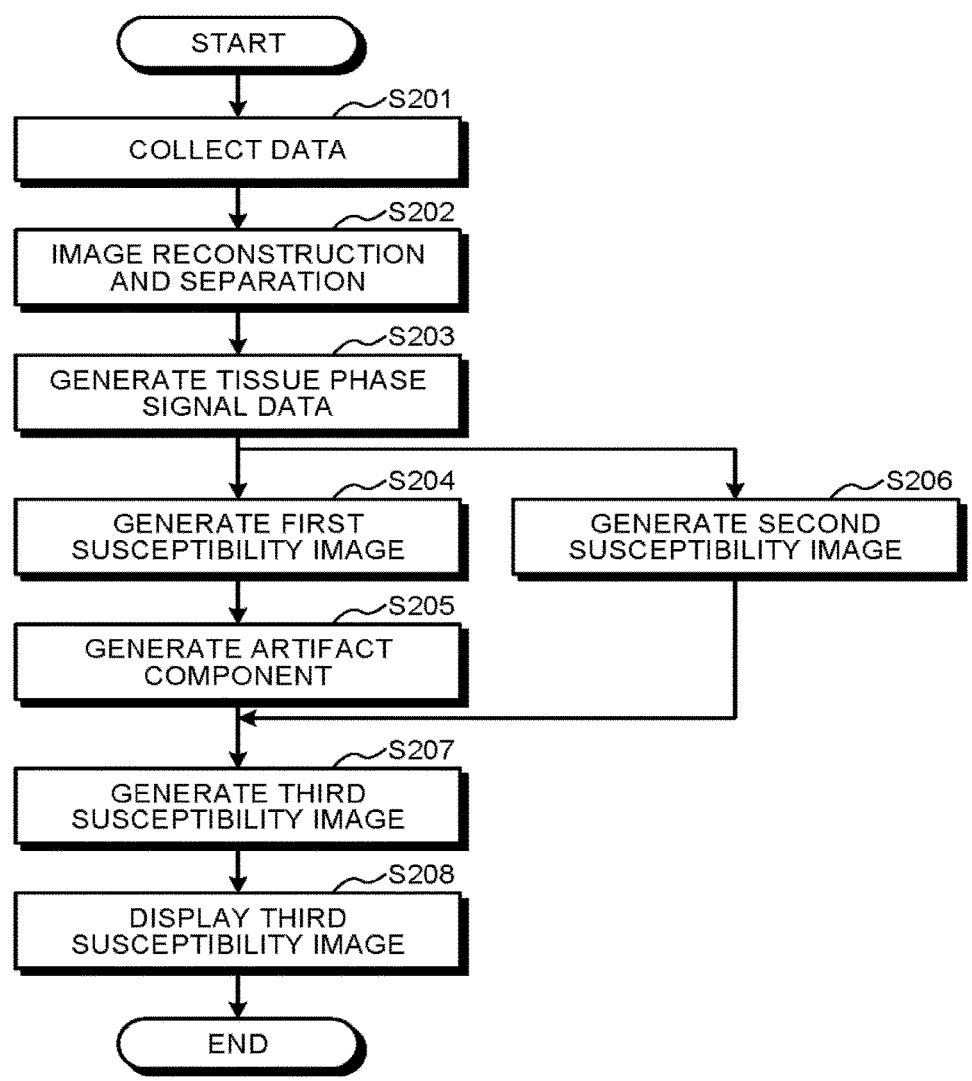
FIG. 11 is a flowchart illustrating the process of image processing performed by the MRI apparatus according to the second embodiment.

FIG. 11 is a flowchart illustrating the process of image processing performed by the MRI apparatus according to the second embodiment. The sequence controller 23 receives a setting of an imaging plan from the operator and collects data (Step S201), and the separation function 28a separates the complex data generated by the image generation circuitry 25 as data of an image into magnitude signal data and phase signal data (Step S202). The phase processing function 28b generates tissue phase signal data by using the aforementioned phase unwrapping and background field removal (Step S203). The first susceptibility image generation function 28c then generates a first susceptibility image by using Equation (6) above under p=2 (Step S204). In other words, the first susceptibility image generation function 28c generates the first susceptibility image under a condition that is relatively likely to cause an artifact component. The artifact generation function 28d generates an artifact component (Step S205). The processes described above are the same as those described in the flowchart in the first embodiment (Steps S101 to S105).

The second susceptibility image generation function 28e generates the second susceptibility image in the same manner as the first susceptibility image generation function 28c generates the first susceptibility image. For example, the second susceptibility image generation function 28e generates the second susceptibility image by using Equation (6) under p=1 (Step S206). The second susceptibility image generation function 28e generates the second susceptibility image under a condition that is less likely to cause an artifact component than the condition for generating the first susceptibility image. In other words, the second susceptibility image generation function 28e generates the second susceptibility image under a condition different from the condition for generating the first susceptibility image.

The third susceptibility image generation function 28f multiplies the artifact component generated at Step S205 by a certain coefficient α and subtracts the artifact component multiplied by the certain coefficient α from the second susceptibility image, thereby generating a third susceptibility image (Step S207). The third susceptibility image generation function 28f generates the third susceptibility image by using the second susceptibility image and the artifact component and by removing or reducing the artifact component from the second susceptibility image. In other words, at Step S207, the third susceptibility image generation function 28f generates the third susceptibility image that is an artifact component-reduced or removed susceptibility image (a susceptibility image from which the artifact component is reduced or removed) by reducing or removing the artifact component from the second susceptibility image. The value of the certain coefficient α is determined such that the artifact component multiplied by the certain coefficient α has substantially the same magnitude as that of the second susceptibility image. The system controller 27 causes the display 22 to display the third susceptibility image (Step S208) and the image processing ends.

At Step S207, a third susceptibility image from which an artifact component having a wide width is reduced or removed is generated based on an artifact component. At Step S205 before Step S207, the artifact generation function 28d generates the artifact component from the frequency signal of the first susceptibility image 21 as information used for preventing a certain type of artifact such as an artifact having a wide width from occurring. Thus, the MRI apparatus 100 according to the second embodiment can generate information used for preventing a certain type of artifact from occurring.

FIG. 12 is a diagram illustrating an example of processing performed by the MRI apparatus according to the second embodiment. At Step S206, the second susceptibility image generation function 28e generates a three-dimensional second susceptibility image 39 by using Equation (6) under p=1 as illustrated in the example of FIG. 12. FIG. 12 illustrates projections of the second susceptibility image 39 each projected on the fx-fy plane, the fz-fy plane, and the fx-fz plane.

The third susceptibility image generation function 28f multiplies the artifact component 34 by the certain coefficient α and subtracts the artifact component multiplied by the certain coefficient α from the second susceptibility image 39, thereby generating a three-dimensional third susceptibility image 40. FIG. 12 illustrates projections of the artifact component 34 and projections of the third susceptibility image 40 each projected on the fx-fy plane, the fz-fy plane, and the fx-fz plane.

In the same manner as in the first embodiment, the first susceptibility image generation function 28c may generate the first susceptibility image $\chi 1$ by using a parameter different from the parameter used in generating the second susceptibility image $\chi 2$ by the second susceptibility image generation function 28e so that the artifact generation function 28d generates the artifact component accurately.

For example, the first susceptibility image generation function 28c may set the regularization parameter $\lambda$ in Equation (6) to a smaller value to enhance the artifact component, or may change the iteration number of the optimization for generating the first susceptibility image $\chi 1$. The first susceptibility image generation function 28c may generate the first susceptibility image $\chi 1$ without using the weighting coefficient W or gradient parameter G (assuming that both W and G are 1) in Equation (6).

The third susceptibility image generation function 28f according to the second embodiment performs the weighted difference processing in accordance with the susceptibility value of each pixel in the second susceptibility image in the same manner as the second susceptibility image generation function 28e according to the first embodiment performs the weighted difference processing. The third susceptibility image generation function 28f may perform the weighted difference processing in accordance with the signal ratio between the first susceptibility image and the second susceptibility image. The third susceptibility image generation function 28f may perform these two types of weighted difference processing.

Configurations of the MRI apparatus 100 according to the first embodiment and those of the MRI apparatus 100 according to the second embodiment may be combined as appropriate. For example, the MRI apparatus according to the second embodiment may prepare a plurality of masking regions and iteratively generate artifact components in the same manner as in the first embodiment. FIG. 13 is a flowchart illustrating the process of image processing for iteratively generating artifact components from a plurality of masking regions and repeatedly generating the third susceptibility image in the second embodiment. As illustrated in FIG. 13, after the third susceptibility image generation function 28f generates the third susceptibility image (Step S207), the artifact generation function 28d determines whether the processing end condition same as the condition in the first embodiment is satisfied (Step S209). If the processing end condition is satisfied (Yes at Step S209), the system controller 27 causes the display 22 to display the third susceptibility image (Step S208) and the image processing ends.

If the processing end condition is not satisfied (No at Step S209), the artifact generation function 28d sets a different masking region (Step S210) and generates another artifact component (Step S205). Setting a different masking region allows a different frequency component to pass through, thereby generating a different artifact component. Thus, the third susceptibility image generated again at Step S207 is a susceptibility image from which an artifact component having a different width is reduced. The MRI apparatus 100 according to the second embodiment iteratively repeats generation of artifact components by the artifact generation function 28d and generation of the third susceptibility image by the third susceptibility image generation function 28f by applying different types of frequency space masking to the first susceptibility image.

The MRI apparatus 100 according to the second embodiment has been described. The MRI apparatus 100 according to the second embodiment can generate information used for preventing a certain type of artifact from occurring.

Same functions as those included in the susceptibility generation circuitry 28 described above may be included in a medical image processing device. Such a medical image processing device is, for example, a special-purpose or general-purpose computer. The medical image processing device, for example, acquires an image generated based on the MR signal from a subject from a medical image diagnostic apparatus such as an MRI apparatus connected via a network. The medical image processing device executes the same functions as those included in the susceptibility generation circuitry 28 to perform various types of processing on the acquired image. Thus, the medical image processing device can generate information used for preventing a certain type of artifact from occurring in the same manner as in the MRI apparatus 100 according to the first or the second embodiment.

The computer programs of the MRI apparatus according to the first and the second embodiments, which are stored in the storage circuitry, may be installed in the respective components of the MRI apparatus in advance. The computer programs may be recorded and provided in a recording medium such as a compact disc read only memory (CD-ROM) or distributed via a network, and then installed in the components as appropriate. The computer programs may be recorded in a recording medium such as a compact disc recordable (CD-R), a compact disc rewritable (CD-RW), a digital versatile disc random access memory (DVD-RAM), or a DVD recordable (DVD-R) and read and executed as appropriate by a processor included in each component.

According to at least one of the embodiments described above, information used for preventing a certain artifact from occurring can be generated. While certain embodiments have been described, these embodiments have been presented by way of example only, and are not intended to limit the scope of the inventions. Indeed, the novel methods and systems described herein may be embodied in a variety of other forms; furthermore, various omissions, substitutions and changes in the form of the methods and systems described herein may be made without departing from the spirit of the inventions. The accompanying claims and their equivalents are intended to cover such forms or modifications as would fall within the scope and spirits of the inventions.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A magnetic resonance imaging apparatus, comprising;
    processing circuitry configured to
        generate an image based on a magnetic resonance signal from a subject,
        generate a first susceptibility image representing magnetic susceptibility of the subject from a phase component contained in a plurality of pixels in the image, generate an artifact component of the first susceptibility image based on a frequency signal obtained by frequency transform of the first susceptibility image, and generate a second susceptibility image by removing the artifact component from the first susceptibility image or from a susceptibility image generated based on the magnetic resonance signal, the susceptibility image being different from the first susceptibility image.

2. The magnetic resonance imaging apparatus according to claim 1, wherein the processing circuitry is further configured to generate the second susceptibility image by removing the artifact component from the first susceptibility image, which is a source of the artifact component, the artifact component being generated from the source.

3. A magnetic resonance imaging apparatus, comprising: processing circuitry configured to generate an image based on a magnetic resonance signal from a subject, generate a first susceptibility image under a condition that is relatively likely to cause an artifact component, the first susceptibility image representing magnetic susceptibility of the subject from a phase component contained in a plurality of pixels in the image, generate a second susceptibility image under a condition that is less likely to cause an artifact component than the condition for generating the first susceptibility image, the second susceptibility image representing magnetic susceptibility of the subject from the phase component contained in the plurality of pixels in the image, generate an artifact component based on a frequency signal obtained by frequency transform of the first susceptibility image, and generate a third susceptibility image by removing the generated artifact component from the second susceptibility image.

4. The magnetic resonance imaging apparatus according to claim 1, wherein the processing circuitry is further configured to generate the artifact component by applying masking to a frequency space of the susceptibility image such that a frequency component at and near a magic angle at which spin-spin interaction is zero passes through.

5. The magnetic resonance imaging apparatus according to claim 1, wherein the processing circuitry is further configured to iteratively repeat generation of the artifact component and generation of the second susceptibility image by applying a different type of frequency space masking to the first susceptibility image.

6. The magnetic resonance imaging apparatus according to claim 2, wherein the processing circuitry is further configured to iteratively repeat generation of the artifact component and generation of the second susceptibility image by applying a different type of frequency space masking to the first susceptibility image, which is the source of the artifact component.

7. The magnetic resonance imaging apparatus according to claim 3, wherein the processing circuitry is further configured to iteratively repeat generation of the artifact component and generation of the third susceptibility image by applying a different type of frequency space masking to the first susceptibility image.

8. The magnetic resonance imaging apparatus according to claim 2, wherein the processing circuitry is further configured to perform weighted difference processing in accordance with a susceptibility value of each pixel in the first susceptibility image, which is the source of the artifact component.

9. The magnetic resonance imaging apparatus according to claim 3, wherein the processing circuitry is further configured to perform at least one of weighted difference processing in accordance with a susceptibility value of each pixel in the first susceptibility image and weighted difference processing in accordance with a signal ratio between the first susceptibility image and the second susceptibility image.

10. The magnetic resonance imaging apparatus according to claim 2, wherein the processing circuitry is further configured to generate the second susceptibility image by using regularization for reducing the artifact component.

11. A medical image processing device, comprising: processing circuitry configured to acquire an image generated based on a magnetic resonance signal from a subject, generate a first susceptibility image representing magnetic susceptibility of the subject from a phase component contained in a plurality of pixels in the image, generate an artifact component of the first susceptibility image based on a frequency signal obtained by frequency transform of the first susceptibility image, and generate a second susceptibility image by removing the artifact component from the first susceptibility image or from a susceptibility image generated based on the magnetic resonance signal, the susceptibility image being different from the first susceptibility image.

* * * * *